United States Patent [19]

Del Mei

[11] 4,118,090
[45] Oct. 3, 1978

[54] ELECTRICAL CONTACT DEVICES

[76] Inventor: Luigi Giovanni Del Mei, 1178 Park St., Pretoria, South Africa

[21] Appl. No.: 815,498

[22] Filed: Jul. 14, 1977

[30] Foreign Application Priority Data

May 23, 1977 [ZA] South Africa ............... 77/3036

[51] Int. Cl.² .................................... H01R 11/30
[52] U.S. Cl. ........................... 339/12 R; 339/28; 339/65
[58] Field of Search .............. 339/12 R, 12 G, 12 V, 339/28, 65, 66 M

[56] References Cited

U.S. PATENT DOCUMENTS 3,363,220  1/1968  Redd et al. .............. 339/64 M X
3,808,577  4/1974  Mathauser .............. 339/12 R Primary Examiner—Roy Lake
Assistant Examiner—DeWalden W. Jones
Attorney, Agent, or Firm—Prutzman, Hayes, Kalb & Chilton

[57] ABSTRACT

This invention relates to device comprising a plurality of movable electrically conductive contacts each having at least one contact surface. The contacts are movable in guide paths in response to application of forces to the contact surfaces. Elastomeric biassing means engage the contacts and bias the contacts to oppose forces applied to the contact surfaces. The elastomeric biassing means preferably comprises a moulded element of elastomeric material bonded to the contacts and restraining the contacts from leaving the guide paths. The contact surfaces can then be provided on one side of said element and terminals for connection to electrical leads can be provided by the contacts at the opposite side of the element.

12 Claims, 8 Drawing Figures

ELECTRICAL CONTACT DEVICES

This invention relates to a device having a plurality of electrically conductive contacts with resilient biassing for ensuring engagement between the contacts of the device and other contacts.

The applicant is aware of devices of this type which have previously been disclosed and which use metallic springs to bias the contacts into engagement. The applicant is also aware of contacts which are inherently resilient. However, these prior devices are not always suitable for small contacts and it is often not possible to bias small contacts using the prior devices. In particular, it is often impossible to provide suitable biassing for a plurality of small contacts in a single device.

The present invention provides a device comprising:
a plurality of movable electrically conductive contact means;
at least one contact surface on each of said contact means, said contact means being movable independently by application of forces to said contact surfaces;
locating means defining guide paths receiving said contact means for guiding the contact means during movement resulting from application of forces to said contact surfaces;
elastomeric biassing means engaging said contact means for biassing said contact means to oppose forces applied to said contact surfaces; and
means for restraining said contact means from leaving said guide paths.

The elastomeric biassing means has an inherent elasticity which can spring-bias the contacts to compensate for irregularities in mating contacts engaging the contact surfaces.

The contact means may comprise elongate elements and said guide paths can be defined by apertures in said locating means. The apertures then slidably receive the elongate elements for guiding said elements longitudinally therein. This makes it possible to utilise and resiliently bias contact means having a pin-like construction with a maximum cross-sectional dimension of 2 mm or less and even of 1 mm or less.

The elastomeric biassing means preferably comprises electrically insulating elastomeric material to insulate the contact means and the restraining means may comprise connections between said contact means and said elastomeric biassing means such as a bond fixing said elastomeric biassing means to said contact means. Retaining means may be provided for securing said elastomeric biassing means to said locating means and for localising deflections of said elastomeric biassing means. This localisation of the deflections of the biassing means enables the contact means to be effectively independently biassed.

The retaining means may be a retaining member on the opposite side of the elastomeric biassing means to the locating means for trapping the elastomeric biassing means between the locating means and the retaining member, the retaining member then having holes aligned with said guide paths for essentially localising the deflection of said biassing means to deflectable regions surrounding respective contact means. In order to minimise accidental damage to the bond between the biassing means and the contact means the retaining member may have rounded edge portions surrounding said holes, the rounded edge portions being at least partially engageable by said elastomeric biassing means on application of sufficient force to said contact surfaces.

The contact means may have contact portions projecting from said locating means and retractable into said locating means, the contact surfaces being provided on said projecting contact portions. The locating means can then provide stop surface means adjacent to said contact means for normally preventing force from being applied to said contact means when the contact portions are retracted into said locating means. This can further reduce the likelihood of shear damage. The contact surfaces can be provided on one side of said elastomeric biassing means and terminals for connection to electrical leads can be provided by said contact means at the opposite side of the elastomeric biassing means to ensure that the leads present only minimal interference with the operation of the device.

The device may form a relay further comprising a carrier movable with respect to said contact means, contacts carried by said carrier and movable with said carrier towards said contact means for engaging said contact means, and means for moving said carrier to bring said contacts into engagement with said contact means. The means for moving said carrier may include a magnetisable element on said carrier and a solenoid secured to said locating means for drawing the magnetisable element towards the solenoid and simultaneously drawing the contacts towards the contact means.

The invention also extends to an electrical connector assembly including units having complementary mating formations and contacts having contact surfaces for engaging one another when the complementary mating formations are in mating relationship, wherein at least one of said units comprises:
elongate electrically conductive contacts movable independently of one another by forces applied to the contact surfaces and acting longitudinally of the contact;
locating means having apertures receiving said contacts to guide said contacts for movement longitudinally of the contacts;
elastomeric biassing means for biassing the contacts against forces applied to the contact surfaces and acting longitudinally of said contacts, said elastomeric biassing means being in permanent engagement with said contacts;
retaining means at the opposite side of the elastomeric biassing means to said locating means and trapping said elasomeric biassing means between said locating means and said retaining means; and
support surfaces on said retaining means for engagement by said elastomeric biassing means at least during movement of said contacts.

The elastomeric biassing means in this assembly may comprise a moulded element of elastomeric material encircling and bonded to the contacts of said at least one unit, the contact surfaces being provided on one side of said element and terminals for connection to electrical leads being provided on the contacts at the opposite side of the element.

The said at least one unit can include a socket for receiving at least part of the other unit. The other unit can comprise an electronic circuit element such as a chip having contacts for engagement by the contacts of said at least one unit and means are then provided for securing said units together.

Further features and embodiments of the invention will now be described, by way of example, with reference to the accompanying drawings in which.

Figure 1:
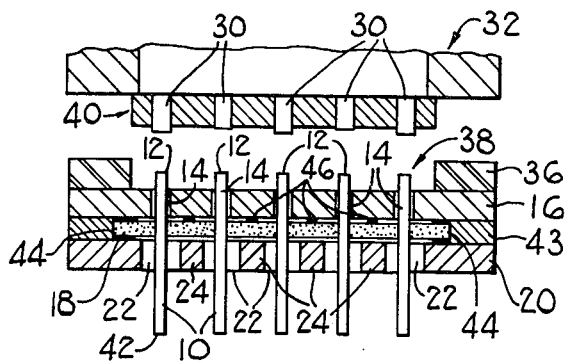
FIG. 1 is a cross-sectional schematic representation of part of an electrical connector assembly including a device according to the invention.

Referring firstly to FIG. 1, a device according to the invention comprises a plurality of movable electrically conductive contacts 10 in the form of elongate cylindrical elements each having a contact surface 12. The contacts 10 are slidably located in cylindrical apertures 14 in a locating element 16. The apertures 14 form guide paths for guiding the contact means lengthwise when forces are applied the contact surfaces 12.

Figure 2:
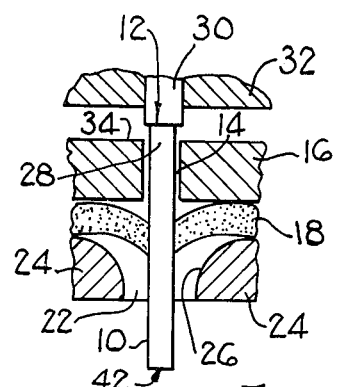
FIG. 2 is an enlarged schematic cross-sectional representation through part of a connector assembly similar to that of FIG. 1.

The contacts are each attached to an electrically insulating elastomeric element 18 which has been bonded to the contacts by moulding the element about the contacts. A retaining member 20 is provided on the opposite side of the elastomeric element 18 to the locating element and traps the elastomeric element between itself and the locating element. The retaining member 20 has holes 22 aligned with the apertures 14 but the diameter of these holes is greater than the diameter of the apertures 14. The retaining member 20 provides spacers 24 between the holes 22 and these spacers together with outer parts of the retaining member, serve to localise the deflection of the elastomeric element 18 to deflectable regions surrounding the respective contacts when forces are applied to the contact surfaces of the contacts. As shown in FIG. 2, the retaining member has rounded edge portions 26 surrounding the holes 22 and these rounded edge portions are engageable by the elastomeric element 18 on application of sufficient force to the contact surfaces.

The provision of these rounded edge portions 26 and the use of holes 22 having diameters substantially greater than the diameters of apertures 14 minimises the likelihood of accidental damage to the bond between the elastomeric element 18 and the contacts 10. In addition the likelihood of damage is further reduced by providing the contacts with contact portions 28 projecting from the locating means and retractable into the locating means by the application of force to the locating means by contacts 30 of a complementary unit 32 if the contact surfaces 12 are provided on the projecting contact portions 28 and the locating means provides stop surfaces 34 adjacent to the contacts for normally preventing force from being applied to the contacts when the contact portions are retracted into the locating means.

Because the elastomeric element 18 is trapped between the locating elements 16 and retaining element 20, the bonds between the elastomeric elements and the contacts serve as restraining means for preventing the contacts from leaving the guide paths in normal operation of the assembly.

The device of FIG. 1 further includes a peripheral locator 36 defining a socket 38 providing a female locating formation for receiving a complementary formation 40 on the complementary unit 32.

The elastomeric element 18 is preferably formed from a silicone elastomer providing good bond strength between the element 18 and the contacts 10 and providing resistance to temperatures which arise during soldering of electrical leads onto the contacts 10. These leads can be secured to terminal portions 42 at the opposite side of the elastomeric element 18 to the contact portions. The elastomer must also provide suitable elasticity to provide spring to the electrical contacts for compensating for irregularities in the levels of the contacts 10 and the contacts 30 of the complementary unit 32.

The use of the elastomer can eliminate the manufacture of tiny springs which would normally be needed to individually spring load the contacts and can reduce the cost of manufacture of spring biassed contact devices. Also, because the need for small springs has been eliminated, a high density of electrical contacts can be achieved and this is particularly important for use in the electronics field. In addition, the elastomeric element can provide an effective water tight or dust-proof barrier preventing water or dust from passing through the apertures 14 and into the holes 22.

For the purpose of attaining this water tight and dust-proof arrangement, the elastomeric element 18 is surrounded by a ring 43 separating the locating element 16 from the elastomeric element 18 and adhesive 44 is provided in a channel formed between the elastomeric element 18 and the locating element, ring and retaining element.

The spacers 24 and the surrounding part of the retaining member 20 serves effectively to localise the deformation of the elastomeric element as mentioned above, and in one embodiment adhesive may be provided at locations 46 for bonding the elastomeric element to the locating element 16 while still allowing localised movement of the elastomeric element. In certain circumstances, the provision of this adhesive may make it possible to eliminate the retaining member 20.

Figure 3:
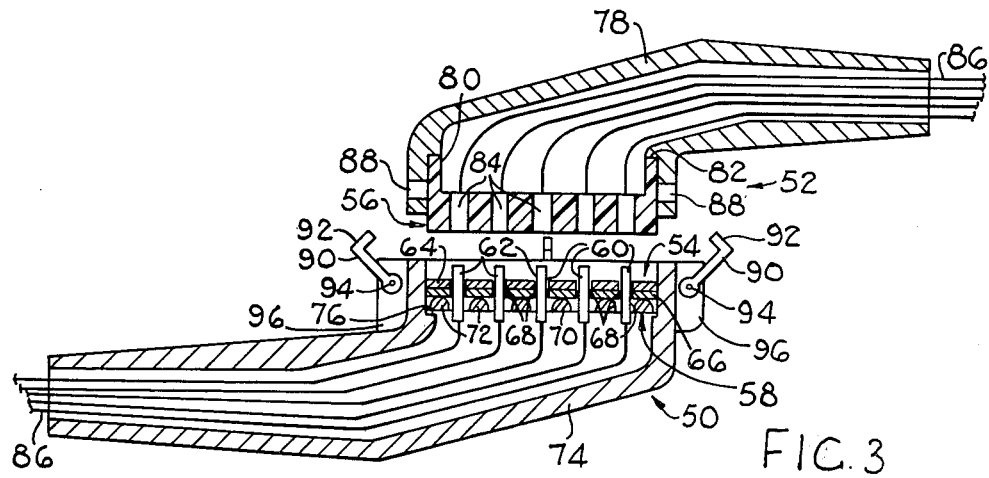
FIG. 3 is a partial cross-section of an electrical connector assembly including two units having complementary mating formations and contact surfaces for engaging one another when the complementary mating formations are in mating relationship.

FIG. 3 shows an electrical connector assembly including first and second units 50 and 52, respectively. The unit 50 defines a socket 54 and the unit 52 has a formation 56 for fitting snugly within the socket.

The first unit 50 includes a device 58 which is similar to the device shown in FIG. 1. This device includes contacts 60 which are guided for longitudinal movement in apertures 62 in a locating element 64. An elastomeric biassing element 66 formed from a moulded elastomer is bonded to the contacts 60 at locations 68 and is trapped between the locating element 64 and a retaining member 70. The retaining member 70 has spacers 72 which are similar to the spacers 24 shown in FIG. 2 and which surround holes in the retaining member, the holes in the retaining member being aligned with but larger than the apertures 62.

The device 58 is fixed in a housing 74, the device resting on a peripheral shoulder 76 within the housing.

The unit 52 includes a housing 78 which receives a contact carrier 80 defining the formation 56. As shown in the drawing, the carrier 80 is fitted in an enlarged socket in the housing 78 and is located by a peripheral shoulder 82. The carrier 80 is moulded about electrically conductive contacts 84 which, as shown, are aligned with the contacts 60 of the unit 50. The contacts 60 and 84 are connected to appropriate electrical leads 86 in any suitable manner, for example by soldering.

The housing 78 contains holes 88 spaced about its periphery. The housing 74, on the other hand, carrier catches 90 with limbs 92 for engaging in the holes 88. The catches 90 are pivotally mounted on pins 94 which are located in flanges 96 on the periphery of the housing 74.

When the formation 56 is inserted into the socket 54, the contacts 84 engage the contacts 60 and the contacts 60 move slidably within the apertures 62 under the force applied to their end surfaces by the contacts 84. The elastomeric element 66 is locally deformed in the regions between the spacers 72 to compensate for differences in the levels of the contact surfaces of the various contacts, the elastomeric element biassing the contacts 60 against the forces applied thereto by the elements 84. The units 50 and 52 can be secured together by pivoting the catches 90 on arms 84 until the limbs 92 are firmly located in the openings 88 in the housing 78.

Figures 6, 8:
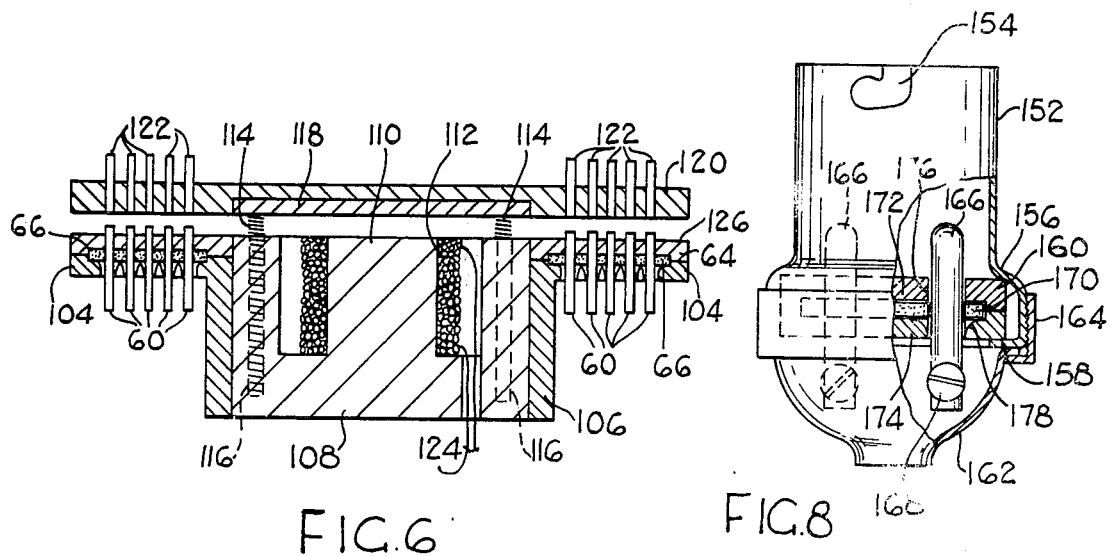
FIG. 6 shows a relay constituting a device according to the invention.
FIG. 8 shows a domestic light bulb socket incorporating the invention.

Units 50 and 52 similar to those shown in FIG. 3 may have the catches 90 and openings 88 omitted, in which case the units may be held together by a screw ring coupling similar to that shown in FIG. 8.

Because of the way in which the units are constructed, it is possible to make the units extremely small, the contacts 60 being, for example, less than about 1 square mm in cross-section.

Figure 4:
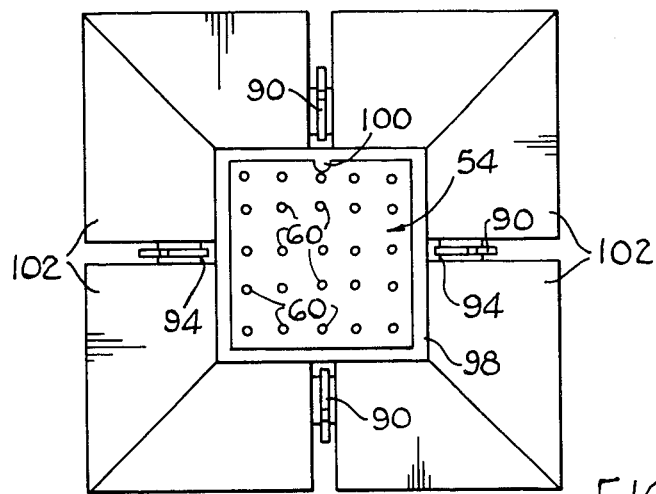
FIG. 4 is a front view of a further device according to the invention.
Figure 5:
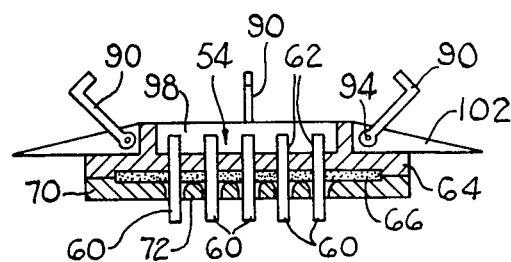
FIG. 5 is a cross-section through the device of FIG. 4.

FIGS. 4 and 5 show a unit of an electrical connector assembly. This unit is to some extent similar to the unit 50 of FIG. 3, being provided with contacts 60 which are slidably located in apertures 62 in a locating element 64. As in FIG. 3, the contacts 60 are bonded within a moulded elastomeric element 66 which is locally deformable into holes between spacers 72 of a retaining element 70. The unit is provided with catches 90 similar to those of FIG. 3 for engaging openings in a unit similar to the unit 52 of FIG. 3. However, the unit of FIGS. 4 and 5 may also be used with other electrical connector units.

The unit of FIGS. 4 and 5 has a socket 54 surrounded by a peripheral wall 98. This peripheral wall carries an inner protrusion 100 and this protrusion can fit into a complementary groove in a formation 56 of a unit 52 similar to that shown in FIG. 3 to ensure that the mating formation can only fit in the socket 54 in a predetermined manner. FIG. 4 clearly shows how the unit can be provided with a large number of contacts in a relatively small area, 25 contacts 60 being provided in FIG. 4. The unit of FIG. 4 is intended for use as a panel unit and is therefore provided with outwardly extending webs 102 for lying against a mounting surface, such as a wall or panel. The catches 90 are pivotally mounted on pins 94 moulded into the webs.

If the unit of FIGS. 4 and 5 is to be used in an electrical connector assembly where the contacts 60 are to be engaged only for a relatively short period of time, the catches 90 can be eliminated and the webs 102 can be united to form a single peripheral extension from the wall 98.

FIG. 6 shows a relay incorporating sets of contacts 60 which are slidable in apertures in a locating element 64 and which are bonded to respective elastomeric elements 66. Retaining members 104 provided by flanges on a tubular housing 106 hold the elastomeric elements 66 in place and serve to localise deflection of the elements in a manner similar to that shown in FIG. 2. The elemets 60 are each connected to respective electrical leads (not shown).

The housing receives a metal core 108 having a central portion 110 which is surrounded by a solenoid coil 112. Springs 114 are located in tubular spring seats 116 in the core 108 and normally bias a magnetisable element 118 away from the core 108. The element 118 is carried by a carrier 120 which also carries contacts 122, the contacts 122 being aligned with the contacts 60. The carrier 120 is guided for movement towards and away from the core 108 by conventional guide means (not shown).

When the coil 112 is energised by electrical current supplied through supply lead 124, the core and coil serve as a solenoid and draw the element 118 towards the core. This brings the contacts 122 into contact with the contacts 60, the contacts 60 being moved by the contacts 122. The localised deformation of the elastomeric element 66 services to hold the contacts 60 in engagement with the contacts 122 and that surface 126 of the locating element 64 facing towards the carrier 120 serves to limit the extent to which the contacts 60 can be forced through their respective apertures and thus prevent accidental shearing of the contacts from the element 66.

Figure 7:
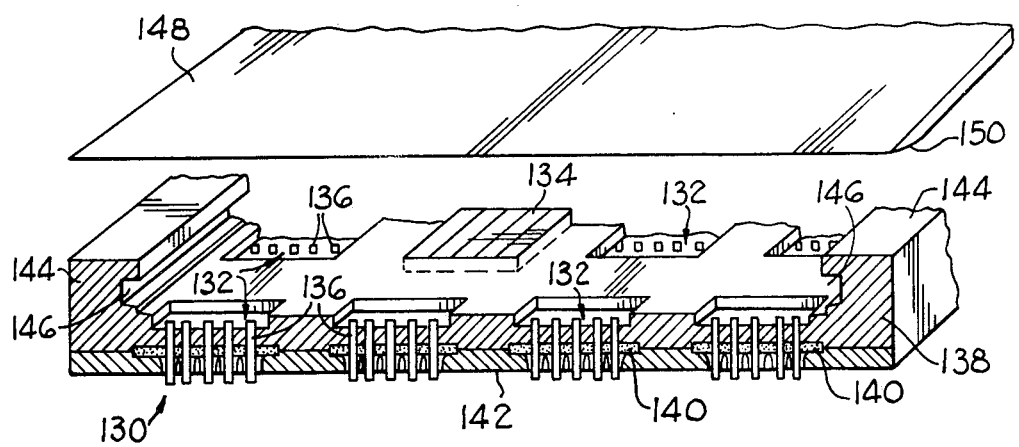
FIG. 7 shows an electrical connector assembly including a base unit, chip unit and lid.

FIG. 7 shows an alternative form of electrical connector assembly intended for use with micro circuits. This assembly inludes a main unit 130 having sockets 132 for receiving electronic circuit elements 134, only one of which is shown. The electronic circuit element in this case is a chip having metal plated contact surfaces for engagement by contacts 136 of the main unit. The unit 130 is shown with only five contacts in each socket although the number of contacts can be increased as necessary. The contacts 136 are slidable in apertures in a locating element 138 and are bonded into elastomeric elements 140, the elastomeric elements and thus the contacts being held in place by a retaining member 142. The retaining member has holes which are aligned with the apertures in the locating member 138 but which are larger than the apertures to allow localised deflection of the elements 140.

The locating element 138 has raised walls 144 extending along its opposite edges and these walls provide grooves 146 for receiving a lid 148. The lid has a cambered leading edge 150 so that when the lid is placed into the groove and slides within the groove, the cambered leading edge 150 acts as a camming surface to press chips 134 into their respective sockets, the lid then holding the chips in the sockets and in engagement with the contacts 136. The elastomeric elements 140 compensate for irregularities in the level of the contacts 136 and in the levels of the contact surfaces on the chips 134.

Finally, FIG. 8 shows a domestic application of a device according to the invention. As shown, a light bulb socket of substantially conventional external construction comprises a first portion 152 having notches 154 for engaging pins on a light bulb and for retaining the light bulb in place. The portion 152 includes a shoulder 156 and a flange 158. A device 160 according to the invention is trapped non-rotatably between the shoulder 156 and the flange 158. A lower portion 162 of the socket is fixed to the portion 152 by a screw ring 164.

The device 160 comprises a pair of contact pins 166 having screws 168 screwed into holes in the pins for clamping electrical leads in the pins in a conventional manner. The pins 166 pass through and are bonded to an elastomeric element 170 which is trapped between a locating element 172 and a retaining member 174, the element 172 and member 174 being adhesively bonded together and adhesively bonded to a peripheral portion of the elastomeric element 170.

The pins 166 are slidable in apertures 176 in the locating element 172 and also pass through holes 178 in the member 174. The corners of the holes are rounded as in FIG. 2.

When a light bulb is inserted in the socket provided by the portion 152, the pins 166 slide in the apertures 176 and the element 170 is locally deformed while the pins of the light bulb are inserted into the notches 154. The member 170 presses the pins 166 against the contacts on the light bulb.

Clearly, for this application, the material used for the elastomeric member 170 must be suitably resistant to temperatures which are likely to be met in practical use and suitable silicone elastomers are preferred.

I claim:

1. A device comprising:
    a plurality of movable electrically conductive contact means;
    at least one contact surface on each of said contact means, said contact means being movable independently by application of forces to said contact surfaces;
    locating means defining guide paths receiving said contact means for guiding the contact means during movement resulting from application of forces to said contact surfaces;
    elastomeric biassing means engaging said contact means for biassing said contact means to oppose forces applied to said contact surfaces, said biassing means comprising electrically insulating elastomeric material; and
    means for restraining said contact means from leaving said guide paths comprising connections between said contact means and said elastomeric biassing means.

2. The device of claim 1, wherein said contact means comprise elongate elements and said guide paths are defined by apertures in said locating means, said apertures slidably receiving said elongate elements for guiding said elements longitudinally therein.

3. The device of claim 2, wherein said restraining means comprises a bond fixing said elastomeric biassing means to said contact means and wherein retaining means are provided for securing said elastomeric biassing means to said locating means and for localising deflection of said elastomeric biassing means.

4. The device of claim 2, wherein said contact means have contact portions projecting from said locating means and retractable into said locating means, the contact surfaces being provided on said projecting contact portions, and wherein said locating means provides stop surface means adjacent to said contact means for normally preventing force from being applied to said contact means when the contact portions are retracted into said locating means.

5. The device of claim 1, wherein the elastomeric biassing means comprises a moulded element of elastomeric material and the restraining means comprises a bond between said moulded element and said contact means, the contact surfaces being provided on one side of said element and terminals for connection to electrical leads being provided by said contact means at the opposite side of said moulded element.

6. The device of claim 1, further comprising a retaining member on the opposite side of the elastomeric biassing means to the locating means for trapping said elastomeric biassing means between the locating means and the retaining member, the retaining member having holes aligned with said guide paths for essentially localising deflection of said biassing means to deflectable regions surrounding respective contact means.

7. The device of claim 6, wherein said retaining member has rounded edge portions surrounding said holes, the rounded edge portions being at least partially engageable by said elastomeric biassing means on application of sufficient force to said contact surfaces.

8. The device of claim 1, further comprising a carrier movable with respect to said contact means, contacts carried by said carrier and movable with said carrier towards said contact means for engaging said contact means, and means for moving said carrier to bring said contacts into engagement with said contact means.

9. The device of claim 8, wherein the means for moving said carrier includes a magnetisable element on said carrier and a solenoid secured to said locating means for drawing the magnetisable element towards the solenoid and simultaneously drawing the contacts towards the contact means.

10. An electrical connector assembly including units having complementary mating formations and contacts having contact surfaces for engaging one another when the complementary mating formations are in mating relationship, wherein at least one of said units comprises:
    elongate electrically conductive contacts movable independently of one another by forces applied to the contact surfaces and acting longitudinally of the contact;
    locating means having apertures receiving said contacts to guide said contacts for movement longitudinally of the contacts;
    elastomeric biassing means for biassing the contacts against forces applied to the contact surfaces and acting longitudinally of said contacts, said elastomeric biassing means being in permanent engagement with said contacts;
    retaining means at the opposite side of the elastomeric biassing means to said locating means and trapping said elastomeric biassing means between said locating means and said retaining means; and
    support surfaces on said retaining means for engagement by said elastomeric biassing means at least during movement of said contacts.

11. The electrical connector assembly of claim 10 wherein the elastomeric biassing means comprises a moulded element of elastomeric material encircling and bonded to the contacts of said at least one unit, the contact surfaces being provided on one side of said element and terminals for connection to electrical leads being provided on the contacts at the opposite side of the element.

12. The electrical connector assembly of claim 10, wherein said at least one unit includes a socket for receiving at least part of the other unit, wherein said other unit comprises an electronic circuit element having contacts for engagement by the contacts of said at least one unit, and wherein means are provided for securing said units together.

* * * * *